United States Patent
Sharma

(10) Patent No.: US 12,144,410 B2
(45) Date of Patent: Nov. 19, 2024

(54) NAIL DISPLAY DEVICE AND SYSTEM

(71) Applicant: Rajesh Sharma, Nottingham (GB)

(72) Inventor: Rajesh Sharma, Nottingham (GB)

(73) Assignee: CAPTIVATIUN LIMITED, London (GB)

( * ) Notice: Subject to any disclaimer, the term of this patent is extended or adjusted under 35 U.S.C. 154(b) by 230 days.

(21) Appl. No.: 17/692,917

(22) Filed: Mar. 11, 2022

(65) Prior Publication Data

US 2022/0192342 A1  Jun. 23, 2022

Related U.S. Application Data

(63) Continuation of application No. PCT/GB2020/052165, filed on Sep. 9, 2020.

(30) Foreign Application Priority Data

Sep. 12, 2019  (GB) .................................... 1913168

(51) Int. Cl.
| | |
|---|---|
| A45D 31/00 | (2006.01) |
| G06F 1/16 | (2006.01) |
| G06F 3/14 | (2006.01) |
| H10K 77/10 | (2023.01) |

(52) U.S. Cl.
CPC .............. *A45D 31/00* (2013.01); *G06F 1/163* (2013.01); *G06F 1/1652* (2013.01); *G06F 1/1698* (2013.01); *G06F 3/1431* (2013.01); *H10K 77/111* (2023.02); *G06F 1/1635* (2013.01)

(58) Field of Classification Search
CPC ...... A45D 31/00; A45D 44/005; G06F 1/163; G06F 1/1652; G06F 1/1698; G06F 3/1431; G06F 1/1635; G06F 1/16; H10K 77/111
See application file for complete search history.

(56) References Cited

U.S. PATENT DOCUMENTS

| | | | |
|---|---|---|---|
| 2010/0066710 A1 | 3/2010 | Koibuchi | |
| 2011/0025599 A1* | 2/2011 | Kim | G06F 3/1431 |
| | | | 345/156 |
| 2011/0061670 A1* | 3/2011 | Schneider | C09K 19/586 |
| | | | 132/73 |
| 2014/0183342 A1* | 7/2014 | Shedletsky | H10K 59/13 |
| | | | 250/215 |
| 2015/0189971 A1* | 7/2015 | Hakeem | A45D 31/00 |
| | | | 132/200 |
| 2017/0060267 A1 | 3/2017 | Piccionelli | |
| 2017/0299912 A1 | 10/2017 | Wang et al. | |
| 2018/0242708 A1 | 8/2018 | Felzer et al. | |
| 2020/0135063 A1* | 4/2020 | Jang | G06F 1/1652 |

FOREIGN PATENT DOCUMENTS

WO  WO 2016/081787 A2  5/2016

OTHER PUBLICATIONS

International Search Report from International Application No. PCT/GB2020/052165, dated Nov. 23, 2020.
Written Opinion of the International Searching Authority from International Application No. PCT/GB2020/052165, dated Nov. 23, 2020.

* cited by examiner

*Primary Examiner* — Antonio Xavier
(74) *Attorney, Agent, or Firm* — Gerald T. Gray; Leydig, Voit & Mayer, LTD.

(57) ABSTRACT

A nail display device comprising a display configured to be removably mounted relative to a nail of a user, and at least one control board associated with the display to control media displayed on the display.

18 Claims, 3 Drawing Sheets

NAIL DISPLAY DEVICE AND SYSTEM

TECHNICAL FIELD

The present invention relates generally to the field of decorating fingernails or toenails. In particular, but not exclusively, the invention concerns an apparatus to be worn by a user allowing selectable decoration or colouring of fingernails or toenails.

BACKGROUND

Fingernails have been decorated to provide an aesthetic appearance or to provide a message. In the past, fingernails were tattooed or lasered to provide a decoration.

Tattooing is usually performed with a press-on decal or manually painting. Lasering usually requires the use of skilled people.

Washable tattoos are commercially sold which are applied to both toenails and fingernails. However, such tattoos are not useful or are lost at the beach or swimming pools.

Many users apply 'fake nails' relative to their own nails. Fake nails are available in many types including acrylic, gel and other materials. Available fake nails utilise chemical based glue to attach the fake nail relative to the user nail or nail bed. These glues solution constitute a health risk to users.

Further, once applied, some fake nails cannot be removed by the user which increases further cost and its time consuming.

U.S. Pat. No. 5,931,166 is directed towards utilizing inkjet printing and sputtering technology to create an aesthetic appearance to nails. The method disclosed in U.S. Pat. No. 5,931,166 provides capturing an image of a subject's fingernail, electronically forming a first fingernail image information representative of the subject's fingernail. The method further provides electronically processing the fingernail's image information to determine the fingernail size and boundary. Optionally, using a stereo imaging or grid projection technique to completely determine the fingernail topography, selecting a design, and then printing out or sputtering on a fingernail said preselected design. Further, in a most preferred embodiment the human hand is secured in a template to immobilize the hand so as to decorate the fingernails more closely and evenly There presently exists a need to provide a technology which can satisfy the fashion needs of the population without fear of injury or health concerns and which can be rapidly and accurately performed.

Embodiments of the present invention seek to overcome/ameliorate these or other disadvantages and/or to provide an improved nail display device system.

SUMMARY

According to a first aspect of the invention there is provided a nail display device comprising a display configured to be removably mounted relative to a nail of a user, and at least one control board associated with the display to control media displayed on the display.

According to a second aspect of the invention there is provided a nail display device system comprising a display configured to be removably mounted relative to a nail of a user, at least one control board associated with the display to control media displayed on the display, a wireless communication module associated with the at least one control board and a computer software program operating on a personal computing device to allow a user to issue instructions to the at least one control board via the wireless communication module to change the media displayed on the display.

According to a third aspect of the invention, there is provided a nail display device system comprising a display configured to be removably mounted relative to a nail of a user, at least one control board associated with the display to control the media displayed on the display, a wireless communication module associated with the at least one control board and a personal computing device operating a computer software program to allow a user to issue instructions to the at least one control board via the wireless communication module to change the media displayed on the display.

Providing a nail display device including a display configured to be removably mounted relative to a nail of a user and a control board to control the media displayed on the display will provide a significant advance in the field of artificial nails, particularly customisable artificial nails, allowing a user to change the appearance of the nail display device as required. The present invention will also provide a nail display device which is removable from the user's nail or nail bed, by the user, as required which will typically contribute to the health of the nail.

The nail display device of the present invention will typically be sold in sets including a plurality of nail display devices, for the nails of one or two hands and/or one or two feet. Normally, the sets include either five nail display devices or 10 nail display devices for either one hand or two hands of a user.

A nail display device may be configured to be applied to the nail of a user's finger or a user's toe. The nail display device will typically be shaped slightly differently for finger application or for toe application. The nail display device may be able to be reshaped and/or resized (preferably only slightly) in order to more closely match the size and/or shape of a user's natural nail or nail bed.

Where sold in a set, the nail display devices within the set may have different shapes and/or sizes in order to fit different nail shapes and/or sizes. For example, a user's thumbnail will typically be larger than the other nails of the hand and therefore, a larger nail display device may be provided for the thumb, with smaller nail display devices for the other nails. Fitting and shaping at manufacture and/or bespoke manufacture may be required.

The nail display device may have a curvature. The nail display device may be curved from front to back. The nail display device may be curved from side to side.

The nail display device may have any shape and/or size. The particular shape and configuration of the nail display device particularly an underside thereof, is preferably configured as closely as possible to the user's natural nail or nail bed, with a minor degree of sizing and shaping possible.

The nail display device will typically be programmable in order to display colours, patterns or other media thereon at the decision of the user. The media displayed on the nail display device will typically be adjustable by the user. The information display may relate to colour, pattern, finish (gloss or matt), display media according to a theme or any other media. The media displayed on the nail display device may result in the nail display device having a static display or a dynamic display.

The nail display device of the present invention, even where provided in a set, will preferably be controlled individually and therefore, the nail display devices that a user wears may have the same or similar information displayed thereon or the information could be completely different such as for example, one of the nail display devices worn on each hand may be a "highlight" nail with a pattern or different colour displayed thereon.

A number of nail display devices may be controlled together.

A controller will typically be provided on each nail display device. In an embodiment, the controller will preferably be a chipset 16 MHz 32 bit with SWD interface. The chip will preferably include Bluetooth 5.1 communication capabilities. In an embodiment, a chipset measuring 2.0×1.7 mm is used, with on board memory, radio transceiver and integrated power management.

The nail display device of the present invention comprises a display configured to be removably mounted relative to a nail of a user. The display will preferably be a flexible display, in order to allow for variations in the shape of the user's nail or nail bed. The display will preferably be generally nail shaped, either according to the shape of the user's natural nail or nail bed, or a desired nail shape.

Preferably, the display is provided over the entire area of the nail.

The nail display device of the present invention will typically be constructed using a number of layers. Typically, the layers will be built up one on top of one another. Preferably, each of the layers will extend over the entirety of the area of the nail display device. Each of the layers will typically be shaped to the user's nail or nail bed.

A lowermost layer will typically be or include an adhesive layer such as an adhesive tape for example in order to attach the nail display device relative to a user's nail or nail bed. The adhesive layer may be a discontinuous layer.

A double-sided adhesive tape may be provided as a separate layer which the user can cut to size/shape and apply to their natural nail prior to attaching the nail display device relative thereto.

Alternatively, a lowermost adhesive layer may be provided on the rear of the nail display device and the entirety of the nail display device shaped and/or sized to suit and then applied to the user's nail or nail bed.

A lower base layer is preferably provided. In an embodiment, a control board layer is preferably provided above the adhesive layer. Preferably, the control board layer is or includes a flexible control board in order to control the display. The control board layer may be integrated into or connected to the rear of a display layer. Other layers are preferably located or formed on top of the control board layer.

In an embodiment, a low-temperature polycrystalline silicon (LTPS) layer is provided. An LTPS layer preferably functions as a thin-film transistor (TFT) layer. Typically, a layer of this type is provided on or in or built upon, a substrate. Typically, the substrate is flexible. Although a rigid material such as glass may be used, is preferred that a flexible substrate is provided. The TFT layer may also be referred to as a TFT backplane.

Thin metal foils such as stainless steel, and thin polymer substrate materials can be used as substrates. Metal foil substrates offer the advantages of higher process temperature capability (for TFT fabrication), dimensional stability (no shrinkage of the substrate due to the temperature cycles associated with the TFT fabrication), and being impervious to oxygen and moisture. Limitations of metal foil substrates include requiring top emission OLED device architecture due to the opaqueness of the substrate, and poor surface smoothness characteristics.

Use of metal foil substrates typically requires consideration of the capacitive coupling (parasitic capacitance) of the substrate to the backplane. The metal foil substrates will generally need to be smoothed by either polishing (for example by using chemical-mechanical polishing), or by applying additional surface smoothing layers, to achieve acceptable yield of the TFT and OLED devices to be fabricated. The backside of the metal substrate will normally be protected from the process chemicals during the backplane fabrication. In general, a metal foil substrate, by itself, is a good barrier (for oxygen and moisture) and may not require an additional, lower, barrier layer. However, the display fabricated using the metal foil substrate would still typically require a good barrier layer to be applied on top of the preferred display layer.

A transparent plastic substrate has the advantage of being compatible with both the bottom emitting and the top emitting OLED device architectures. A transparent plastic substrate is also compatible with transmissive and transflective active matrix liquid crystal display (AM LCD) displays, thereby making them suitable for a broader range of applications. Also, some plastic substrate materials, such as polyethylene naphthalate (PEN) films (Teonex® brand—Q65), are fully compatible with the TFT fabrication chemistry.

Limitations of the plastic substrates include limited process temperature capability, lack of dimensional stability (during TFT processing involving high temperatures), and differences in the linear thermal coefficient of expansion (TCE) between the plastic substrate and the TFT thin films. TCE mismatch is an issue for stainless steel substrates as well, particularly if higher process temperatures are utilized.

The nature of the TFT layer will normally be chosen based on a combination of considerations including high optical transmission in the visible range (>87%), low moisture pickup, reasonable dimensional stability, reasonable surface smoothness, compatibility with TFT process chemistry, and the reasonable TCE match with the TFT thin films.

A flexible plastic substrate is preferred. A polyester plastic substrate is more preferred. A polyethylene naphthalate (PEN) such as Teijin® Teonex® PEN film substrate is most preferred.

Polyethylene naphthalate (PEN) substrates in general, meet the requirements, including a TFT fabrication temperature of around 150° C. It should be noted that while PEN is superior to other available plastic substrates with respect to moisture pickup, dimensional stability, and smoothness etc., substantial improvements are still possible in these characteristics for active matrix organic light emitting diode display (AM OLED) applications.

A pre-stabilization process involving annealing of the plastic substrates in vacuum at 160° C. to increase the dimensional stability may be used improve plastic substrate characteristics.

To reduce or preferably eliminate the dimensional changes associated with moisture absorption/de-sorption during TFT processing, a moisture barrier deposition process can be used. After the substrate pre-stabilization, and prior to the TFT array fabrication, a plasma deposited SiNx film can be deposited on both sides of the preferred PEN substrate. The SiNx film maintains the substrate's dimensional stability by eliminating moisture absorption during the TFT array fabrication processes, and the associated dimensional changes that occur with moisture absorption.

One or more display layers are preferably provided above the TFT backplane. Any type of display media may be used in or as the display layer. Typically, the display is provided in a single layer, preferably directly upon the TFT backplane.

As mentioned above, a variety of display media can be considered for display applications. For a reflective display based on modulating the reflected ambient light, bistable display media such as electrophoretic, cholesteric LC mode, and MEMS type displays could be used. Bistable reflective displays have the excellent low-power potential. However, for night time viewability, front lighting is required which increases the display power consumption. Other general shortcomings of this type of display media are slower display response time, and poor colour capability compared to transmissive LCD displays and OLED displays.

AM OLED (Active matrix organic light emitting diode display) technology is preferred to provide a rugged, full colour, lightweight, low power and low-cost flexible displays. AM OLED technology based on rigid glass and flexible substrates is advancing rapidly. An AM OLED display based on a flexible plastic substrate is preferred.

Since the preferred plastic substrates are generally not impermeable enough to protect the OLEDs, a barrier layer will normally be added to the substrate, at least at an upper side. Further, whether using a plastic substrate or a stainless steel substrate, the top side of the OLED will preferably be protected with an impermeable encapsulation layer. The OLED may be encapsulated on all sides using one or more encapsulation layers. The display may be completely encapsulated using one or more encapsulation layers.

For protection of an OLED display, any barrier layer should have a permeability less than $1e^{-6}$ gm/m$^2$/day for moisture and $1e^{-5}$ mL/m$^2$/day for oxygen.

A preferred AM OLED display is built from a number of layers. In an embodiment, the preferred AM OLED display includes a primer layer. The primer layer is preferably formed directly on top of the TFT backplane.

An anode layer is preferably provided. The anode layer is preferably formed on the primer layer by deposition.

An emissive layer is preferably provided. The emissive layer is preferably formed on the anode layer by evaporation. The emissive layer is preferably one or more light-emitting layers of an organic semiconductor material. Emission of light from the emissive layer is typically via the TFT (LTPS) layer.

A cathode layer is preferably provided. The cathode layer is preferably formed on the emissive layer by deposition.

Other layers may be provided to improve the functionality of the OLED layer. For example, the anode may be provided with an ultrathin layer of another organic semiconductor as a spacer layer between the anode layer and the light-emitting organic semiconductor layer which may improve electrical conductivity.

TFT backplane technology is an important enabler for the fabrication of AM OLED displays. The conventional glass-substrate-based TFT process cannot be used with the preferred plastic substrates, primarily because of the low-process temperature constraint. Due to the limitations of lower process temperature, lack of dimensional stability, and the thermal stresses due to the TCE mismatch between the TFT thin films and the substrate, there are two main approaches for producing plastic TFT backplanes:

1. Conventional (high temperature) TFT fabrication on a rigid glass substrate, followed by transfer of the TFT circuit (backplane) on to a plastic substrate by adhesive bonding at a temperature less than 150° C. This process is referred to as Device Layer Transfer (DLT) process.

2. Fabrication of TFT array directly on the plastic substrate. This involves fabricating polysilicon (ULTPS—Ultra Low Temperature Poly Silicon), or a-Si:H, or Organic TFT (OTFT) at a temperature less than 150° C., directly on the plastic substrate.

Either approach may be used but fabrication of TFT array directly on the plastic substrate is preferred.

Two main methods can be used to produce TFT backplanes directly on the preferred plastic substrates. In a first method, the substrate is first bonded to a rigid carrier-substrate such as glass using a temporary adhesive, for ease of handling during TFT array fabrication. After the TFT array is fabricated, the substrate with the backplane circuit is separated from the temporary adhesive (and the carrier substrate). The temporary adhesive will preferably be compatible with TFT process conditions. In the second method, the TFT array is fabricated on the substrate directly, without the use of a carrier.

The DLT process provides a viable approach for displays, when low cost is not a consideration. This approach can provide the most optimum TFT device performance with respect to mobility, leakage current, stability and uniformity as the TFTs are fabricated using conventional LTPS (low temperature polysilicon at ~400° C.) process, and then transferred on to the plastic substrate at a low temperature. Even single crystal silicon TFTs from a silicon wafer can be transferred on to a plastic substrate.

The ultra-low temperature poly-silicon (ULTPS) thin film transistor (TFT) approach can provide high mobility, complementary metal-oxide-semiconductor (CMOS) TFT devices suitable for driving OLED pixels, as well as for fabricating the row and column drivers directly on a preferred plastic substrate.

Organic TFTs (OTFT) can provide very low-cost manufacturing. Impressive progress continues to be made on this approach and TFT performance (mobility, threshold voltage, and leakage current) adequate for driving an OLED pixel has already been demonstrated.

As mentioned above, at least one encapsulation or barrier layer may be provided. An encapsulation or barrier layer preferably comprises a multi-layer stack of inorganic barrier films and organic compliant films. In this scheme, the inorganic films serve as a barrier film for oxygen and moisture, organic layers serve the planarization/smoothing function, and multiple layers provide redundancy against pin hole defects in the barrier films.

The encapsulation layer is preferably transparent in the visible region and is compatible with top emission OLED displays.

A material such as PU/PVC-TPE/EPDM or similar material may be used to encapsulate the display. Typically, the material will be provided in an increased pressure situation and inject into the mould cavity where the display is located. The encapsulating material may be RIM moulded to encapsulate the display. Use of an appropriate material and process to encapsulate the display will generally mean that the encapsulating material cannot be removed from the display once the display is encapsulated.

Encapsulation of a 3-dimensional display (curved in one or more directions) will preferably form an encapsulated display. The encapsulation of a 3-dimensional display may be achieved using at least one glass layer. The at least one glass layer may be a tempered glass layer. The encapsulated display is preferably configured to be removably mounted relative to a nail of a user.

The encapsulated display is typically waterproof/weather proof. The encapsulated display is typically is preferably sealed, including against heat and cold.

Preferably, the layers used in the nail display device are thin layers. In the OLED field, the term 'thin layer' is used to refer to layers that can be nanometre-thin layers.

In an embodiment, the TFT layer is laid down, followed by an AM OLED layer and an encapsulation layer follows the AM OLED layer. Each of these layers can comprise multiple internal layers.

Any type of power supply for the nail display system can be provided. Typically, the power supply will include one or more batteries. The or each battery will preferably hold a temporary charge in order to power the nail display device for a period of time. In an embodiment, the or each battery will be rechargeable. Preferably, a recharging mechanism will be used which does not require a connection and recharging using a contact system such as induction charging for example is preferred. The nail display devices may be placed at least partially within a charging case for recharging.

In an embodiment, the nail display device may include a wireless communication module. The wireless communication module may be provided on or associated with the control board layer. Preferably, the at least one communication module is offset from other components in the control board layer, particularly the on-board power supply, in order to minimise the thickness of the nail display device.

The at least one communication module will preferably send and/or receive information/instructions/requests in relation to the media to be displayed on the nail display device. The at least one communication module will typically be associated with the control board such that any information/instructions received can be acted on by the control board in order to adjust the display. Whilst any communication methodology can be followed, it is preferred that a system such as low energy Bluetooth® is used.

Information relating to the display and/or the media to be displayed will typically be stored on the control board. Information relating to the display and/or the media to be displayed may be transmitted to the control board in order to update the display. The control board may be provided with memory in order to store instructions or information relating to the display and the media to be displayed thereon.

The display will typically be operable in a display mode in which the display is operational and/or media is displayed thereon. The display will also preferably have an off mode where the display is inactive. When the display is inactive, a base colour may be provided such as grey or black for example.

Instructions for operation of the nail display device may be transmitted to the nail display device from a remote source. In an embodiment, a software application may be provided to operate on a personal computing device such as a smart phone or tablet for example, and through which a user can select media to be displayed on one or more nail display devices and then forward instructions to the nail display device(s) in order to cause the media to be displayed thereon.

Typically, the software application will require pairing or similar at first use in order to form a communication pathway between the software application and one or more nail display devices. Once the pairing has occurred at first use, the communication pathway will typically be revived when the nail display devices are to be used. This can occur through a sync functionality.

The software application may be provided to control all aspects of the operation of the nail display devices including powering on and off as well as any adjustment to the media displayed on any one or more of the nail display devices. The software application will typically generate and display one or more electronic interfaces on a display of a personal computing device such as a smart phone or tablet, allowing the user to control one or more nail display devices. Normally, there will be an actuation button or similar in order to initiate any changes to the display, which will cause transmission of the instructions from the software application to the control board of one or more nail display devices.

As mentioned above, the simplest configuration of media which will be displayed on the nail display is typically a uniform colour on the nail display device. The display may be a static display or a dynamic display.

The instructions may be sent directly to the nail display devices from the personal computing device. The instructions may be sent to the nail display devices via a computer network.

The software application operating on the personal computing device or via network may allow a user to set up a user profile and save preferences according to their use. A user may be able to purchase media to be displayed on the nail display device such as different colours or patterns. A user will typically be able to purchase media through the software application operating on the personal computing device, obtain the media and send the media to one or more of their nail display devices in order to cause the appearance of the nail display devices to be adjusted accordingly.

The instructions may be stored on the control board or in the software application or on the network or any one or more of these in case any of the nail display devices have problems and require resetting or retransmission or reimplementation of the instructions to cause the display of the media thereon.

Although the nail display device of the embodiments may include a number of layers that are each flexible, it is preferred that the plurality of layers used in the nail display device, the preferred method of forming the layers on top of one another and/or the materials themselves, provides a nail display device with a level of rigidity that is substantially the same as convention gel or acrylic nails.

In an embodiment, updating the display of one or more nail display devices will preferably temporarily fix the display on the nail display device until updated further. In other words, the display of one or more nail display devices, once instructions have been issued will typically display the media instructed until the nail display devices are instructed to change the media displayed.

In this way, a user can select what is displayed on the nail display devices to adjust the appearance of the nail display devices as required according to the user's preference. The nail display devices can be easily removed from the users nail or nail bed which will typically maintain a healthy natural nail which will therefore allow the now displays of the present invention to be more easily attached and detached as desired.

BRIEF DESCRIPTION OF THE DRAWINGS

In order that the invention may be more clearly understood one or more embodiments thereof will now be described, by way of example only, with reference to the accompanying drawings, of which.

DETAILED DESCRIPTION

With reference in to the accompanying Figures, a nail display device 10 is provided. The nail display device illustrated in FIGS. 1 to 5 in particular comprises a flexible display configured to be removably mounted relative to a nail of a user, and a flexible control board associated with the display to control media displayed on the display.

The nail display device 10 of the illustrated embodiment is configured to be applied to a user's finger, but it will be immediately recognised that the nail display device is equally applicable to being applied to a toe.

Where sold in a set, the nail display devices within the set may have different shapes and/or sizes in order to fit different nail shapes and/or sizes. For example, a user's thumbnail is typically larger than the other nails of the hand and therefore, a larger nail display device is generally provided for the thumb with smaller nail display devices for the other nails.

Figure 1:
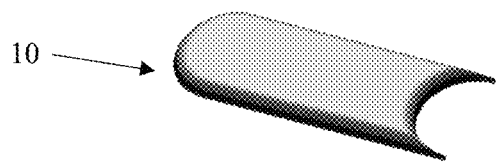
FIG. 1 is an isometric top view of a nail display device according to an embodiment.
Figure 2:
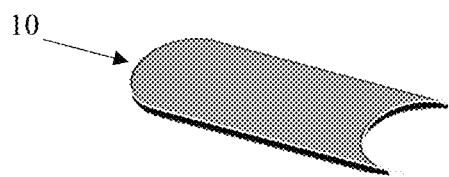
FIG. 2 is an isometric bottom view of the nail display device illustrated in FIG. 1.
Figure 3:
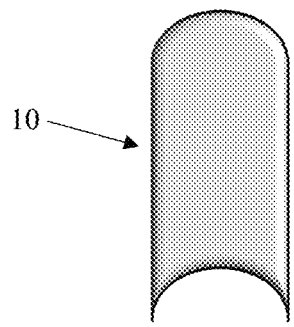
FIG. 3 is a plan view of the nail display device illustrated in FIG. 1.
Figure 4:
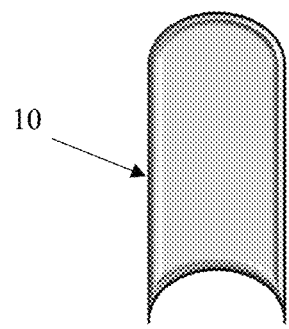
FIG. 4 is a bottom view of the nail display device illustrated in FIG. 1.
Figure 5:
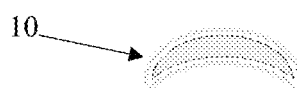
FIG. 5 is an end view of the nail display device illustrated in FIG. 1.

As illustrated in FIG. 5 in particular, the nail display device 10 is curved from side to side.

The particular shape and configuration of the nail display device is preferably configured as closely as possible to the user's natural nail or nail bed, with a minor degree of sizing and shaping possible. Excessive shaping or size reduction will likely adversely affect the operating layers explained below and is therefore to be avoided. The illustrated embodiment shows a set of nails for a single hand that have been manufactured after sizing. A nail fitting may be required.

The nail display device 10 is programmable in order to display one or more colours, patterns or other media thereon at the decision of the user. The media displayed on the nail display device 10 is adjustable by the user. The information displayed may relate to colour, pattern, finish (gloss or Matt), according to a theme or any other media. The media displayed on the nail display device 10 of the illustrated embodiment results in a static display.

The nail display device, even where provided in a set, is controlled individually but to display the same media, for example to represent the same colour on the five nails on a user's hand.

The nail display device 10 is configured to be removably mounted relative to a nail of a user. The nail display device 10 includes a flexible display, in order to allow for small variations in the shape of the user's nail or nail bed. The display will preferably be generally nail shaped as shown in FIGS. 1 to 5, either according to the shape of the user's natural nail or nail bed or a desired shape.

Preferably, the display layer (described below) is provided over the entire area of the nail display device 10 which will cover the entirety of the user's nail or nail bed.

Figure 6:
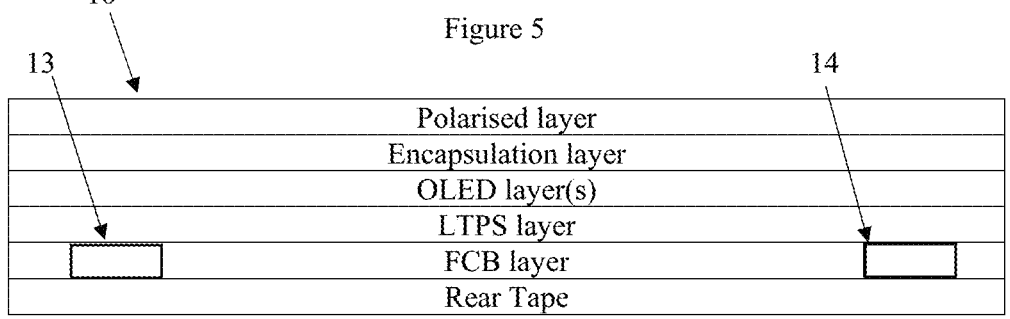
FIG. 6 is a schematic sectional view of the nail display device illustrated in FIG. 1.

According to an embodiment, the nail display device is constructed using a number of layers, built up one on top of one another as illustrated schematically in FIG. 6. Each of the layers extend over the entirety of the area of the nail display device 10, although there may be some tapering of the layers at the edges.

As shown in FIG. 6, the lowermost layer is an adhesive layer such as an adhesive tape for example, in order to attach the nail display device 10 relative to a user's nail or nail bed. A double-sided adhesive tape is provided as the lowermost layer which the user can cut to size/shape and apply to their natural nail prior to attaching the nail display device 10 relative thereto.

In a bespoke, fully fitted configuration, the lowermost layer is provided on the rear of the nail display device 10 and the entirety of the nail display device 10 is shaped and/or sized to suit and then applied to the user's nail or nail bed.

In the embodiment illustrated in FIG. 6, flexible control board layer is provided above the adhesive layer, in order to control the display. The control board layer may be integrated into or connected to the LTPS layer and/or the rear of the OLED display layer.

A low-temperature polycrystalline silicon (LTPS) layer is provided in the embodiment shown in FIG. 6. The LTPS layer preferably functions as a thin-film transistor (TFT) layer. Typically, the TFT layer is built upon a substrate. In the illustrated embodiment, the substrate is flexible.

A transparent plastic substrate is compatible with both the bottom emitting and the top emitting OLED device architecture illustrated in FIG. 6. An example plastic substrate material, polyethylene naphthalate (PEN) films (Teonex® brand—Q65), is fully compatible with the TFT fabrication chemistry.

One or more OLED display layers are preferably provided above the TFT backplane. Typically, the OLED display layer is provided in a single layer (but comprising a number of different layers internally, directly upon the TFT (LTPS layer) backplane.

An active matrix organic light emitting diode (AM OLED) display provides the most rugged, full colour, lightweight, low power and low-cost flexible displays. An AM OLED display based on a flexible plastic substrate is used in the illustrated configuration.

The polyethylene naphthalate (PEN) plastic substrate is not typically impermeable enough to protect the OLEDs, an encapsulation barrier layer with a permeability less than $1e^{-6}$ gm/m$^2$/day for moisture and $1e^{-5}$ mL/m$^2$/day for oxygen, is added to the plastic substrate.

A preferred AM OLED display layer is built from a number of layers. In an embodiment, the preferred AM OLED display includes a primer layer formed directly on top of the TFT backplane (LTPS layer).

An anode layer is then provided, preferably formed on the primer layer by deposition.

An emissive layer is then provided above the anode layer. The emissive layer is formed on the anode layer by evaporation. The emissive layer includes one or more light-emitting layers of an organic semiconductor material.

A cathode layer is provided above the emissive layer. The cathode layer is formed on the emissive layer by deposition.

Other layers may be provided to improve the functionality of the OLED layer. For example, the anode layer may be provided with an ultrathin layer of another organic semiconductor as a spacer layer between the electrode and the light-emitting organic semiconductor.

As mentioned above, at least one encapsulation layer is provided. A typical encapsulation or barrier layer consists of a multi-layer stack of inorganic barrier films and organic compliant films. In this scheme, the inorganic films serve as a barrier film for oxygen and moisture, organic layers serve the planarization/smoothing function, and multi-layers provide redundancy against pin hole defects in the encapsulation layer.

Vitex Systems has developed a moisture barrier film used for OLED encapsulation called Vacuum Polymer Technology (VPT) which is equivalent to glass in terms of water or oxygen penetration and can be applied to flexible substrates or over a finished display.

The encapsulation layer is transparent in the visible region and compatible with top emission OLED displays.

In an illustrative embodiment, the TFT (LTPS) layer is laid down, followed by an AM OLED layer and an encapsulation layer follows the AM OLED layer, each of which can have multiple layers. This forms the display. An FCB layer is provided beneath the LTPS layer. A lower adhesive layer and an outer polariser layer are provided to finish the nail display device as shown in FIG. 6.

The nail display device 10 of an embodiment can be extremely thin. For example, an embodiment can have a display with an overall thickness of approximately 0.67 mm±0.06 mm including the adhesive tape layer. This is made up of the following components with dimensions:

| | |
|---|---|
| Polariser | 0.163 mm |
| Encapsulation | 0.20 mm |
| LTPS | 0.20 mm |
| Adhesive Tape | 0.110 mm |

The nail display device 10 is typically associated with an on-board power supply, preferably on or within the FCB layer.

Typically, the power supply includes a battery 14 to hold a temporary charge in order to power the nail display device 10 for a period of time. In an embodiment, the battery 14 is rechargeable. Preferably a recharging mechanism, such as induction charging is used which only requires contact.

A nail display system is provided including a number of comprising a set of nail display devices 10, one for each finger of a user's hand 12, a wireless communication module mounted on the FCB layer of each device and a computer software program operating on a personal computing device, such as a smartphone 11, to allow a user to issue instructions to the each of the set of nail display devices 10 via the respective wireless communication module, to change the media displayed on the display of each of the set of nail display devices 10.

The wireless communication module 13 may be provided within the FCB layer, offset from other components, particularly the battery 14 in order to minimise the thickness of the nail display device 10.

Whilst any communication methodology can be followed, it is preferred that a system such as low energy Bluetooth® is used.

Information and/or the media to be displayed thereon relating to the display is stored on the FCB in the FCB layer. Information relating to the display and/or the media to be displayed thereon can be transmitted to nail display device 10, particularly the respective FCB in order to update the display. The FCB is normally provided with memory in order to store instructions or information relating to the display thereon.

The display will typically be operable in a display mode in which the display is operational and/or information is displayed thereon. The display will also preferably have an off mode where the display is inactive. When the displays inactive, a base colour may be provided such as grey or black for example as illustrated.

Instructions for operation of the nail display device 10 can be transmitted to the nail display device from a remote source, such as the smartphone 11. In an embodiment, a software application is provided to operate on the smartphone 11, and through which a user can select media to be displayed on the nail display devices 10 and then forward instructions to the nail display devices 10 using a Bluetooth® signal or similar 15

Typically, the software application requires pairing or similar at first use in order to form a communication pathway between the software application and the nail display devices. Once the pairing has occurred at first use, the communication pathway can be revived when the nail display devices are to be used. This can occur through a sync functionality.

Normally, there will be an actuation button or similar provided as a part of the software application in order to initiate the changes which causes transmission of the instructions from the software application to the FCB of the nail display devices.

As mentioned above, the simplest configuration of media which will be displayed on the now displays typically be a uniform colour on the nail display device.

Figure 7:
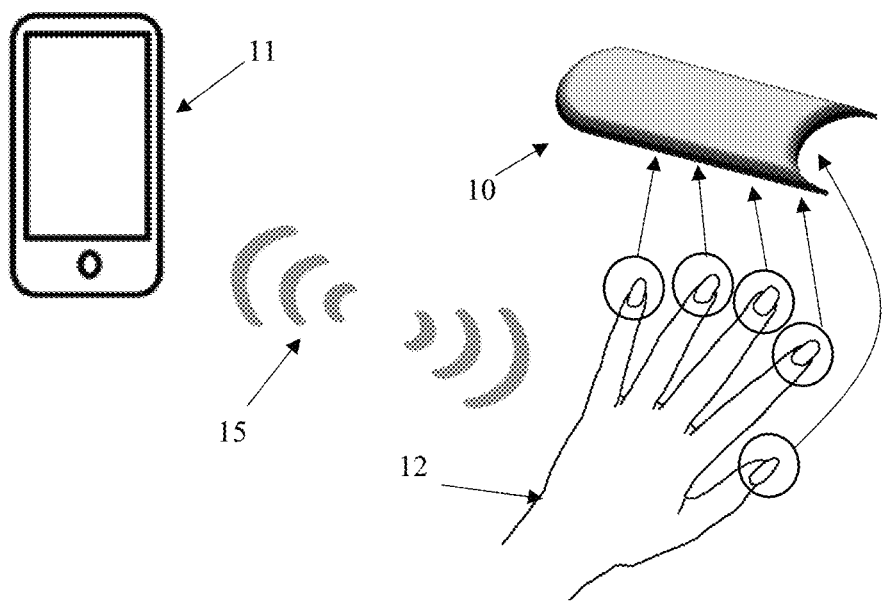
FIG. 7 is a schematic view of a nail display system according to an embodiment.

The instructions may be sent directly to the nail display devices 10 from the smartphone 11 as shown in FIG. 7.

Figure 8:
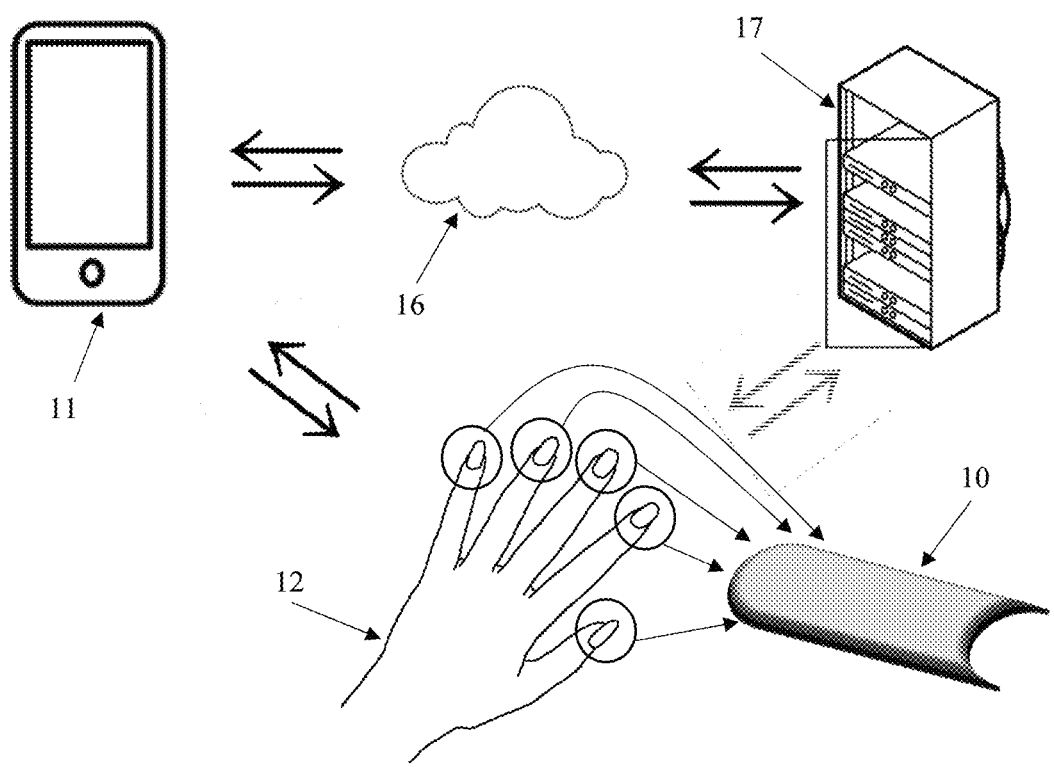
FIG. 8 is a schematic view of a nail display system according to an embodiment.

The instructions may be sent to the nail display devices 10 via a computer network such as is shown in FIG. 8. In the system illustrated in FIG. 8, a user makes a media selection on the smartphone 11 which may obtain media information via a cloud network 16 from a server 17 for example. The user can then use the smartphone to instruct the nail display devices 10. Alternatively, the user may use the smartphone 11 to instruct the nail display devices 10 via the server 17, although this is likely to be less efficient and take more time.

The display instructions may be stored on the FCB of the nail display devices 10 and/or in the software application and/or on the network in case any of the nail display devices have problems and require resetting or retransmission or reimplementation of the instructions to cause the display of the media thereon.

In an embodiment, updating the display of one or more nail display devices will preferably temporarily fix the display on the nail display device until updated further. In other words, the display of one or more nail display devices, once instructions have been issued will typically display the media instructed until the nail display devices are instructed to change the media displayed.

Figure 9:
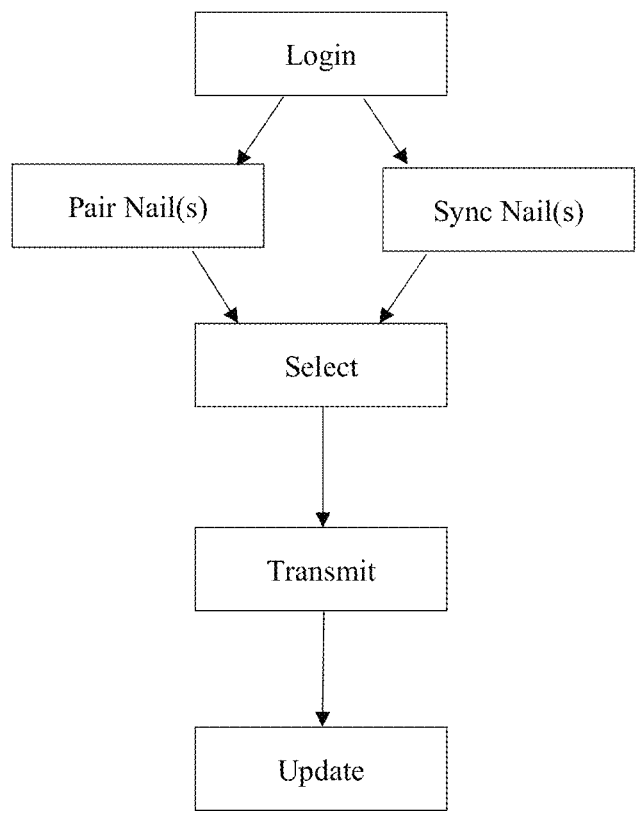
FIG. 9 is a schematic flow diagram showing the operation of a system of an embodiment.

An example methodology for implementation is illustrated in FIG. 9.

In this way, a user can select what is displayed on the nail display devices 10 to adjust the appearance of the nail display devices 10 as required according to the user's preference. The nail display devices 10 can be easily removed from the users nail or nail bed which will typically maintain a more healthy, natural nail, which will therefore allow the nail display devices to be more easily attached and detached as desired.

The one or more embodiments are described above by way of example only. Many variations are possible without departing from the scope of protection afforded by the appended claims.

The invention claimed is:

1. A nail display device comprising a display configured to be removably mounted relative to a nail of a user and provided over an entire area of the nail display device to cover the nail of the user, and at least one control board associated with the display to control media displayed on the display, the at least one control board provided as a first layer and the display provided as a second layer above the first layer, and wherein at least one encapsulation layer is provided as a barrier layer above the second layer, each of the layers extend over the entire area of the nail display device.

2. A nail display device as claimed in claim 1 provided as a part of a set of a plurality of nail display devices, the nail display devices within the set having different shapes and/or sizes in order to fit different nail shapes and/or sizes.

3. A nail display device as claimed in claim 1 wherein the nail display device is curved from side to side.

4. A nail display device as claimed in claim 1 wherein the nail display device is curved from front to back.

5. A nail display device as claimed in claim 1 wherein the display is programmable in order to display media thereon.

6. A nail display device as claimed in claim 1 wherein a lowermost layer comprises an adhesive to attach the nail display device relative to the nail of the user.

7. A nail display device as claimed in claim 1, wherein the at least one control board is or includes a flexible control board configured to control the display.

8. A nail display device as claimed in claim 1 wherein a thin-film transistor layer formed using a substrate is provided.

9. A nail display device as claimed in claim 8 wherein the thin-film transistor layer is formed using a flexible substrate.

10. A nail display device as claimed in claim 9 wherein a transparent plastic substrate is used.

11. A nail display device as claimed in claim 8 wherein one or more display layers are provided above the thin-film transistor layer.

12. A nail display device as claimed in claim 1 wherein the display is provided as an active matrix organic light emitting diode display.

13. A nail display device as claimed in claim 12 wherein the display is built from a number of layers comprising an anode layer, an emissive layer comprising one or more light-emitting layers of an organic semiconductor material, and a cathode layer.

14. A nail display device as claimed in claim 1 with a rechargeable on-board power supply.

15. A nail display device as claimed in claim 1 further comprising a wireless communication module to send and/or receive information or instructions or requests to the at least one control board in relation to media to be displayed on the display of the nail display device.

16. A nail display device system comprising a nail display device as claimed in claim 15 and a computer software program operating on a personal computing device to allow a user to issue instructions to the at least one control board of the nail display device via the wireless communication module in relation to the media displayed on the display.

17. A nail display device system comprising a nail display device as claimed in claim 15 and a personal computing device operating a computer software program to allow a user to issue instructions to the at least one control board of the nail display device via the wireless communication module in relation to the media displayed on the display.

18. A system as claimed in claim 16 wherein the computer software program controls all aspects of operation of the nail display device including powering on and off.

* * * * *